INVENTORS
Herbert D. Adams
Billie J. Cottongim
by Harold Levine
ATTORNEY

INVENTORS
Herbert D. Adams
Billie J. Cottongim
by Harold Levine
ATTORNEY

INVENTORS
Herbert D. Adams
Billie J. Cottongim
by Harold Levine
ATTORNEY 3,371,213

EPITAXIALLY IMMERSED LENS AND PHOTODETECTORS AND METHODS OF MAKING SAME

Herbert D. Adams, Dallas, and Billie J. Cottongim, Richardson, Tex., assignors to Texas Instruments Incorporated, Dallas, Tex., a corporation of Delaware Filed June 26, 1964, Ser. No. 378,160
10 Claims. (Cl. 250—211)

ABSTRACT OF THE DISCLOSURE

Disclosed is a photosensitive device in which the photosensitive device is immersed with a lens, so that the device is a monocrystalline extension of at least a part of the crystal of the lens structure, and the lens is used as the base support of the device.

This invention relates to photosensitive or photoresponsive semiconductor devices, and more particularly to photoresistors, photovoltaic diodes, and other such photodetective devices which are responsive to radiant energy. As used herein, the term photosensitive semiconductor devices includes photovoltaic, photoconductive, and photoelectromagnetic semiconductor devices.

The present invention is particularly useful with (though not limited to) semiconductor infrared detectors and other light-sensitive devices which are operated at low temperatures.

The detectivity of a photodetector is directly related to the amount of light energy absorbed by the detector and to the internal noise of the detector. Accordingly, detectivity can be improved by increasing the amount of light absorbed per unit of surface area of the detector and by reducing the noise. The former may be accomplished by optically focusing incident radiation on the detector surface with a lens. The latter is generally accomplished by operating the detector at very low temperatures. Internal noise is also considerably reduced by reducing the size of the detector. The present invention is ideally suited for economical and simple construction of such miniature devices.

The primary problems generally encountered in attempts to focus radiation on semiconductor photodetector devices are (1) internal reflection of radiation which strikes the lens-detector interface at an angle greater than the critical angle, (2) absorption of energy at the interface between the lens and the detector, and (3) if the lens and detector are physically joined, mismatch of coefficients of thermal expansion of the material of the lens and the material of the detector results in undesirable unequal expansion or contraction of parts when the devices are subjected to substantial temperature change or may result in thermal shock if the temperature change is rapid.

The loss of radiant energy by internal reflection can be avoided by immersing the photodetector within the lens, that is, placing the detector in optical contact with the lens. However, although some of the above problems have been solved for polycrystalline photodetectors such as evaporated lead sulphide, the problems of immersing monocrystalline detectors have remained unsolved. Thus the advantages of monocrystalline detectors have heretofore not been fully utilized.

An example of the prior art problems to which this invention is directed is shown in U.S. Patent 2,964,636 to Cary who shows a polycrystalline photoconductor attached to an immersion lens. Although Cary's photoconductor and lens are disclosed as having approximately matching coefficients of thermal expansion, problems (1) and (2) still remain since radiant energy in Cary's device is still lost by absorption and reflection at the interface between the two dissimilar materials. Further, Cary's concept is also limited to immersed polycrystalline photodetectors. Another problem encountered in the prior art is that assembly of such devices is extremely difficult and expensive because of the minute size of the components and the high degree of precision required.

Briefly, in accordance with the present invention and a principal object thereof, is the provision of an immersed photodetector formed of a single crystalline block of semiconductor material, which stimultaneously eliminates or at least minimizes all three problems of internal reflection, absorption, and mismatch of coefficients of thermal expansion, and also expands the use of immersion lens to a wider range of material for photodetectors while permitting simple and economical manufacture and assembly.

It is also an object of the invention to provide a photosensitive device which is unencumbered by electrical contacts shading the photosensitive surface.

Another object of the invention is to provide an immersed photodetector which is substantially insensitive to thermal shock.

Yet another object of the invention is a method of making an immersion lens for photosensitive devices.

A feature of the invention is the elimination of immersion glasses and bonding procedures in the production of photodetectors.

These and other objects, features, and advantages will become more readily understood from the following detailed description, taken in conjunction with the appended claims and attached drawings, in which:

Figure 1:
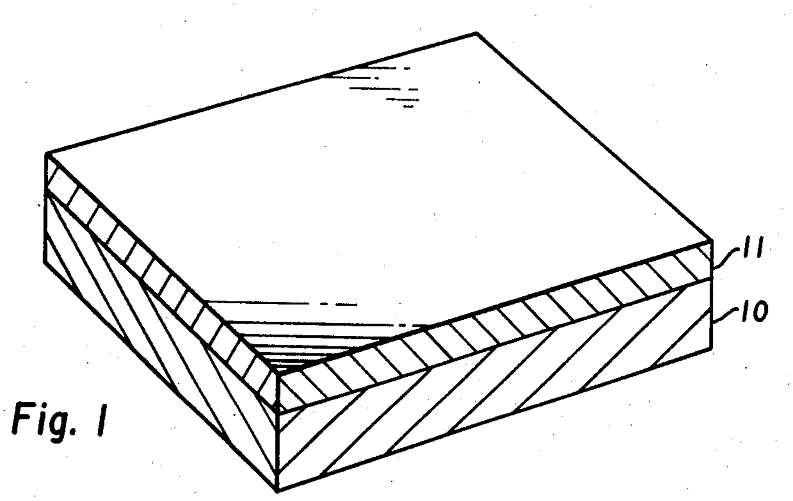
FIGURE 1 is a perspective view partially in section of a transparent crystalline wafer with a layer of photosensitive semiconductor material on one surface thereof.

Dimensions of certain of the parts as shown in the drawings have been modified and/or exaggerated for the purposes of clarity of illustration.

Similar reference characters indicate corresponding parts throughout the several views of the drawings.

Referring specifically to FIGURE 1, a crystalline substrate wafer 10 is shown having a monocrystalline epitaxial layer 11 formed on one side thereof. Layer 11, which is formed into the photosensitive portion of the device as hereinafter described, has a smaller energy band gap than that of the substrate 10, so that the substrate will be substantially transparent to the wavelength of radiation which will be absorbed by layer 11. To assure similarity of coefficients of thermal expansion and crystalline continuity, the unit cell size of the substrate 10 and that of the epitaxial layer 11 should be compatible. By compatible unit cell size is meant that the atomic spacing within the crystalline lattice of each respective material is sufficiently similar to the other to permit the epitaxial growth or extension of one material upon the substrate material without inducing excessive lattice strain at the material interface and throughout the epitaxial layer. Examples of semiconductor materials which may be used in this structure are: indium arsenide on gallium arsenide substrates, germanium on gallium arsenide substrates, and indium arsenide on gallium antimonide substrates. Numerous other suitable combinations of semiconductor materials may be used, choices of which will be dictated by the characteristics desired in a particular photosensitive device, such as, for example, the wavelength to be detected and the cost of the materials to be used.

Conventional methods may be used to form monocrystalline epitaxial layers of semiconductor materials and hence methods of forming such layers need not be described here.

Figure 2:
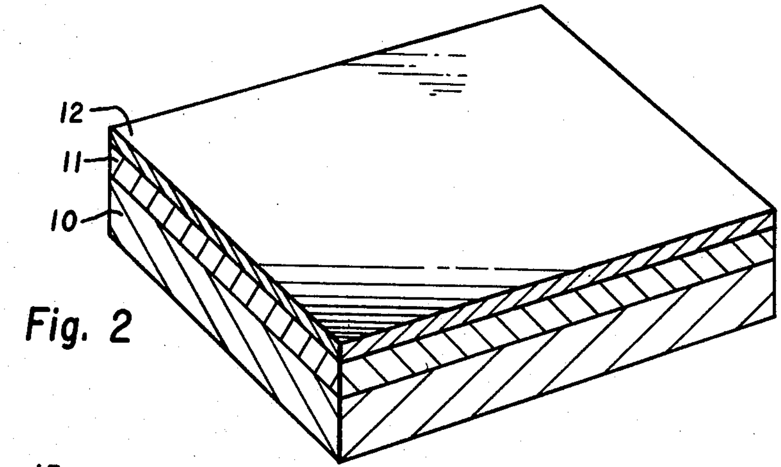
FIGURE 2 is a perspective view partially in section of a transparent crystalline wafer with a layer of photosensitive semiconductor material having a P-N junction formed within the layer.

A P–N junction may be formed in the epitaxial layer 11 by the diffusion of the proper conductivity-type determining impurities thereinto. For example, if the layer 11 is N-type indium arsenide, a P-type region 12, as shown in FIGURE 2, may be formed by diffusing a P-type impurity, such as zinc or cadmium, into a portion of the layer 11 to form a P-type region 12. Alternatively, P-type layer 12 may be formed by epitaxial deposition of P-type indium arsenide on the surface of the N-type indium arsenide layer 11, thereby forming a P–N junction.

It will be noted that only the epitaxial layer need be monocrystalline. The substrate material may be polycrystalline if the degree of polycrystallinity does not substantially degrade its optical properties. However, the portion of the substrate upon which the photodetector material is deposited should be monocrystalline to assure monocrystalline formation of the epitaxial layer.

Figure 3:
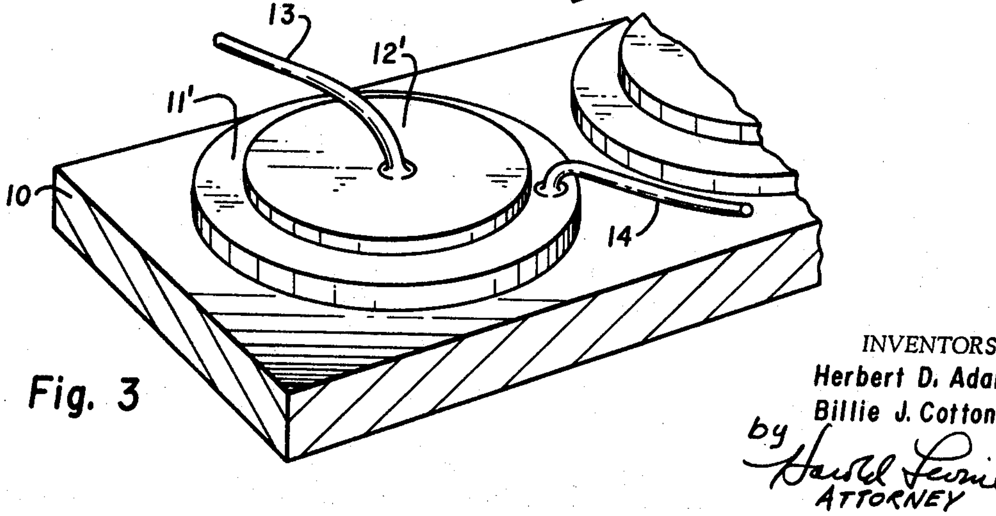
FIGURE 3 is a perspective view of one photovoltaic diode of an array of such diodes formed from the wafer of FIGURE 2.

The assembly of FIGURE 2 is then further processed to form one embodiment of the invention illustrated in FIGURE 3. A crystalline substrate 10, preferably monocrystalline, for example N-type or intrinsic gallium arsenide, is shown having a completed photovoltaic diode formed on one side thereof. The photovoltaic diode is formed by removing a part of the epitaxial layer 11, leaving a circular portion 11' thereof in place on the substrate 10. As shown in FIGURE 3, the circular portion 11' may be formed by conventional masking and etching techniques used in making semiconductor mesa devices. The indium arsenide layers 11 and 12 are further masked and etched to leave a smaller circular portion 12' of layer 12 superimposed on the center of layer 11'. Ohmic contacts 13 and 14 are electrically attached to the P-type layer 12' and the N-type layer 11', respectively. The resultant assembly is an indium arsenide photovoltaic diode having a gallium arsenide substrate adjacent the photosensitive surface thereof, and having both electrical contacts on the opposite side of the diode thereby advantageously avoiding deleterious shading of the photosensitive surface. It will be noted that the photosensitive material 11' and 12' of the photovoltaic diode, being epitaxially grown on the gallium arsenide substrate 10, is formed as a contiguous monocrystalline extension of the crystalline lattice of said substrate. Radiation passing through the gallium arsenide substrate 10 is absorbed by the indium arsenide detector through a surface which is unencumbered by electrodes shading the photosensitive material. Thus the entire photosensitive surface of the photovoltaic diode adjacent the gallium arsenide substrate 10 may be utilized as a photodetector. Since the gallium arsenide band gap, 1.38 ev., is greater than the indium arsenide band gap, 0.33 ev., the gallium arsenide substrate 10 is transparent to the wavelengths to which the indium arsenide detector is sensitive. The device described is particularly suited for detection of radiation in the 1–4 micron range, since gallium arsenide is transparent to wavelengths in this range, while indium arsenide absorbs radiation of these wavelengths.

Although only a single detector cell is shown on the substrate 10 of FIGURE 3, it will be understood that arrays of two or more detectors may be produced simultaneously on a single substrate by the method described above.

It will be further noted that the substrate 10 may be large enough to provide mechanical support and rigidity to the device. Consequently, the photosensitive portion of the device, namely, layers 11' and 12', may be very thin. Furthermore, since the P–N junction is substantially parallel to the flat surface of the substrate 10, all light energy absorbed by the photodetector will create hole-electron pairs within a minority carrier diffusion length of the P–N junction.

It will be further understood that in accordance with this invention, other substrate materials may be selected to provide light filters which transmit desired wavelengths while absorbing higher wavelengths, thus improving the sensitivity of the photovoltaic diode.

Figure 4:
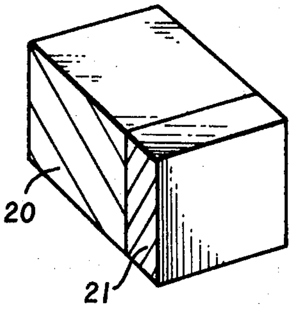
FIGURE 4 is a perspective view of a transparent crystalline block with an epitaxial layer of photosensitive semiconductor material on one side thereof.
Figure 5:
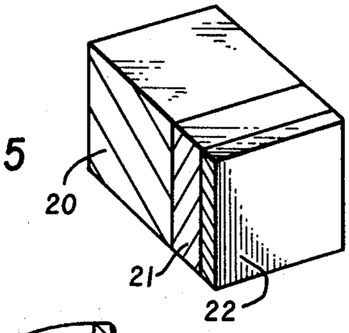
FIGURE 5 is a perspective view of a transparent semiconductor block with an epitaxial layer of photosensitive material containing a P-N junction formed on one surface thereof.
Figure 6:
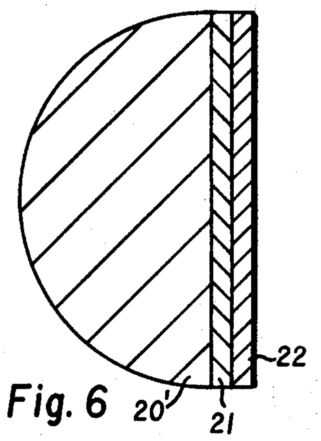
FIGURE 6 is a sectional view of a hemispherical immersion lens formed from the block of FIGURE 5.
Figure 7:
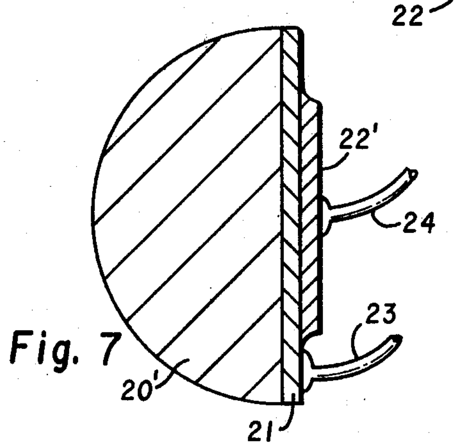
FIGURE 7 is a sectional view of a monocrystalline photovoltaic diode integrally formed on a crystalline lens.
Figure 10:
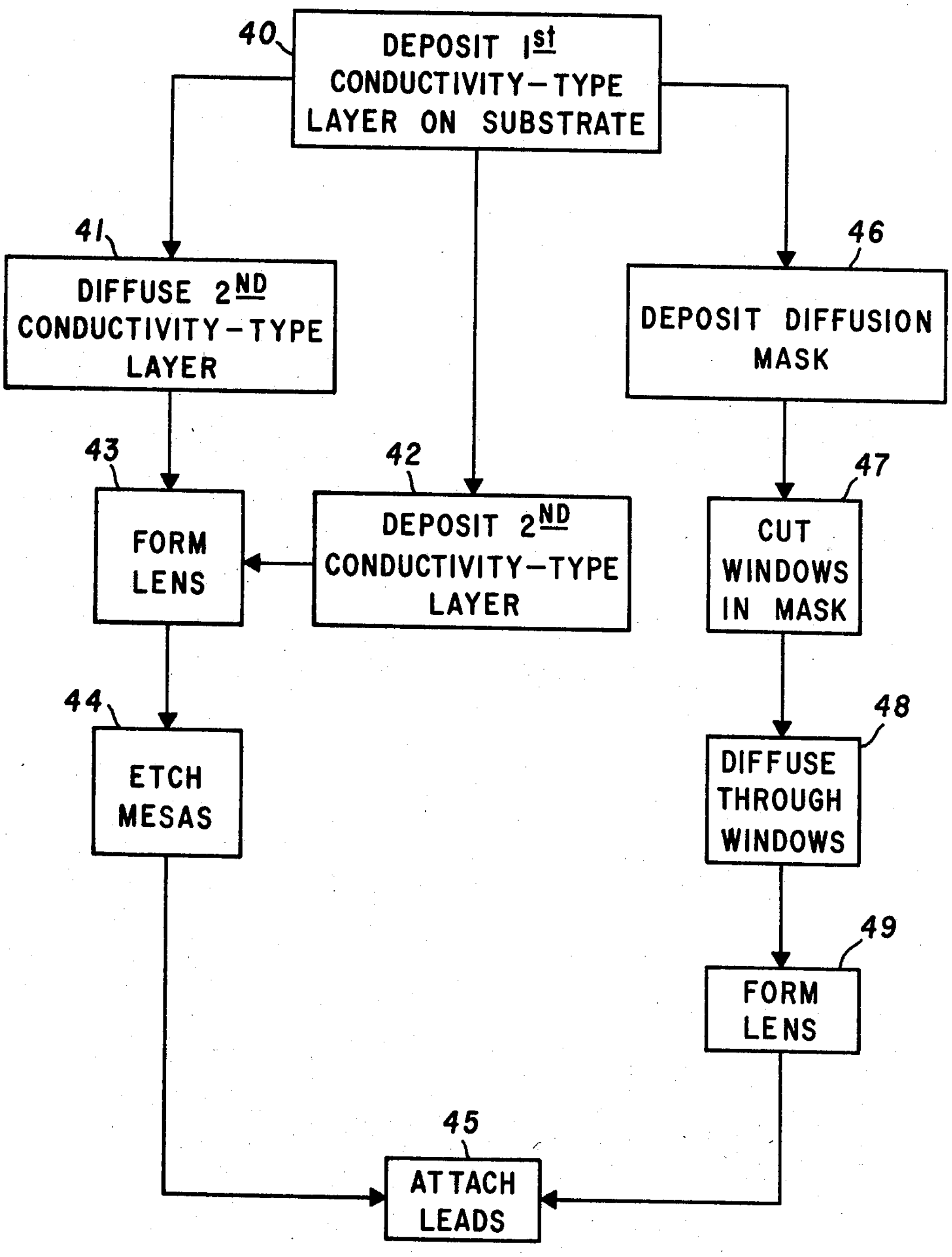
FIGURE 10 is a flow chart outlining the process steps of making an immersed photodiode in accordance with the invention.

Another embodiment of the invention is shown in FIGURES 4, 5, 6 and 7 as produced following steps 40–45 of the flow chart of FIGURE 10. In FIGURE 4, a crystalline semiconductor block 20, for example gallium arsenide, is shown having an epitaxial layer 21, for example N-type indium arsenide, on one face thereof. As shown in FIGURE 5, a P-type indium arsenide layer 22 is then formed by diffusion (step 41 of FIGURE 10) or epitaxial deposition (step 42 of FIGURE 10) as described above to form a P–N junction. The gallium arsenide block 20 is then ground and polished or etched into the shape of a hemispherical lens 20' as shown in FIGURE 6 (step 43 of FIGURE 10). An indium arsenide photovoltaic detector mesa is then formed (step 44 of FIGURE 10) as described above with reference to FIGURE 3 and shown in section in FIGURE 7. The complete photodetector device comprises a hemispherical gallium arsenide lens 20' having an epitaxial layer of N-type indium arsenide 21 on the flat surface thereof, and a P-type layer of indium arsenide 22' adjacent the N-type layer to form a P–N junction therewith. Part of layer 21 is exposed to permit ohmic connection of an electrode 23 with the N-type layer 21. Electrode 24 is attached to form an ohmic contact to the P-type layer 22' (step 45 of FIGURE 10).

Figure 8:
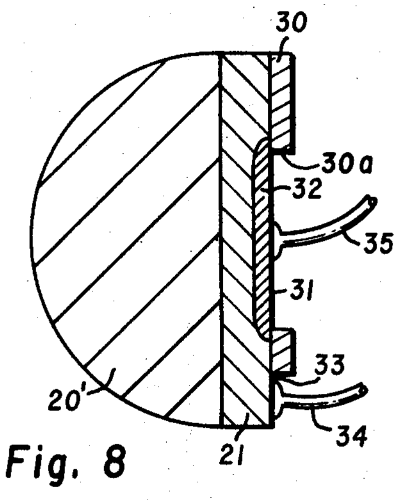
FIGURE 8 is a sectional view of a planar photovoltaic diode integrally formed on a crystalline immersion lens.

FIGURE 8 illustrates a photovoltaic diode formed by planar techniques following steps 46–49 of the flow sheet of FIGURE 10. A hemispherical lens 20' is shown in FIGURE 8 having a layer of N-type indium arsenide 21 integrally formed on the flat side thereof as a monocrystalline extension of the lattice of the lens material. A protective mask 30, for example silicon oxide, is then deposited on the exposed surface of the layer 21 (step 46 of FIGURE 10). By conventional masking and etching techniques, a window or aperture 30*a* is cut into or formed in the mask 30 to expose part of the surface 31 of layer 21 (step 47 of FIGURE 10). Thereafter, P-type conductivity-affecting impurities are diffused into the exposed portion 31 of layer 21 to form a P-type region 32 (step 48 of FIGURE 10). Another portion of the protective mask 31 is removed to allow ohmic connection of an electrode 34 to layer 21. Electrode 35 is electrically attached to the P-type layer 32. The resultant assembly is a planar indium arsenide photovoltaic diode integrally formed on the surface of a gallium arsenide immersion lens.

Figure 9:
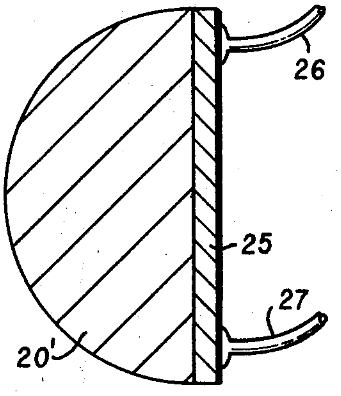
FIGURE 9 is a sectional view of a photoresistor integrally formed on a crystalline immersion lens.

The invention may also be used in other types of immersed radiation sensors. As another example, an immersed photoresistor is shown in FIGURE 9. A layer of photoconductive material 25, such as indium arsenide or germanium, is epitaxially deposited on one surface of a semiconductor substrate 20 which has a greater band gap than the photoconductive material. The substrate 20 is formed into a hemispherical lens and ohmic contacts 26 and 27 secured to the photoconductor 25. Radiation entering the lens 20 is focused on the photoconductor 25 and the change in resistance of the photosensitive material is measured through the electrodes 26 and 27.

It will be seen from the foregoing that FIGURE 10 diagrammatically illustrates three alternative methods for making devices in accordance with the present invention.

It will be seen that in the arrangements of FIGURES 3 and 7–9, the electrical contacts are all arranged on the side of the detector opposite the photosensitive surface thereby advantageously avoiding undesirable shading.

Although the invention has been described with reference to transparent substrates and hemispherical lens, it is to be understood that other optical elements may also be formed. For example, the transparent substrate may be formed into other light-gathering lens, such as aplanatic lens, or light-diffusing lens. Furthermore, other optical elements such as reticles may also be formed from or on the substrate material.

It is to be understood that the above described embodiments of the invention are merely illustrative of the principles of the invention. Numerous other arrangements and modifications may be devised by those skilled in the art without departing from the spirit and scope of the invention as defined by the appended claims.

We claim:

1. A photosensitive device comprising:
(a) a crystalline lens,
(b) a photoresponsive material integrally formed on one surface of said lens as a monocrystalline extension of at least part of the crystalline lattice of said lens, and
(c) electrodes electrically connected with the photoresponsive material.

2. A photosensitive device comprising:
(a) a crystalline lens,
(b) a layer of photoconductive material contiguous with one surface of said lens and forming a monocrystalline extension of the lattice of said lens, and
(c) electrodes electrically connected with said photoconductive layer.

3. A photosensitive device comprising:
(a) a crystalline lens,
(b) a photovoltaic diode contiguous with one surface of said lens and forming a crystalline extension of the crystalline lattice of said lens, said photovoltaic diode comprising a semiconductor body having a P-N junction therein, which junction is substantially parallel to the surface of said lens, and
(c) electrodes electrically connected with said photovoltaic diode.

4. An immersion lens of gallium arsenide having a photoresponsive semiconductor element epitaxially deposited on one surface thereof and forming a crystalline extension of the lattice of at least a portion of said immersion lens.

5. A photosensitive device comprising:
(a) a gallium arsenide immersion lens,
(b) a layer of N-type indium arsenide contiguous with and forming a crystalline extension of the lattice of said lens,
(c) a layer of P-type indium arsenide contiguous with said layer of N-type indium arsenide, and
(d) electrodes electrically connected with said P-type and said N-type indium arsenide layers.

6. The method of making a photosensitive device comprising the steps of:
(a) epitaxially depositing a monocrystalline layer of semiconductor material of a first conductivity-type on one surface of a semiconductor substrate to form a monocrystalline extension of the lattice of said substrate, said substrate having a greater band gap than said layer,
(b) diffusing conductivity-determining impurities of a second conductivity-type into the exposed surface of said layer to form a P-N junction within said layer,
(c) shaping said substrate into an optical lens which focuses incident radiation on said layer, and
(d) attaching electrodes to the P-type portion and to the N-type portion of said layer.

7. The method of making a photosensitive device comprising the steps of:
(a) depositing a monocrystalline layer of semiconductor material of a first conductivity-type on one surface of a monocrystalline substrate, said substrate having a greater band gap than said layer, said layer forming a monocrystalline extension of the crystalline lattice of said substrate,
(b) depositing a second layer of monocrystalline semiconductor material of a second conductivity-type on the exposed surface of said first layer, thereby forming a P-N junction therewithin,
(c) shaping said substrate into an optical lens which focuses incident radiation on said first layer, and
(d) attaching electrodes to the P-type portion and to the N-type portion of said layer.

8. The method of making a photovoltaic diode comprising the steps of:
(a) epitaxially forming a monocrystalline layer of N-type indium arsenide on the surface of a gallium arsenide substrate,
(b) diffusing P-type conductivity-determining impurities into a portion of said indium arsenide layer to form a P-N junction within said layer,
(c) shaping said gallium arsenide substrate into a lens which focuses incident radiation on said indium arsenide layer, and
(d) attaching electrodes to the N-type portion and the P-type portion of said indium arsenide layer.

9. The method of claim 8 wherein said P-type conductivity-determining impurity is zinc.

10. The method of making an immersed planar photovoltaic diode comprising the steps of:
(a) epitaxially depositing a layer of photosensitive semiconductor material of a first conductivity-type which layer is responsive to a selected wavelength of radiation on one surface of a crystalline semiconductor substrate which is substantially transparent to said selected wavelength of radiation thereby to form a monocrystalline extension of the crystalline lattice of said substrate,
(b) placing a diffusion mask on the surface of said epitaxially deposited layer opposite said substrate,
(c) removing a portion of said mask to form an aperture therein, thereby exposing a portion of the surface of said epitaxially deposited layer,
(d) diffusing conductivity-type determining impurities into the surface of said epitaxially deposited layer which is exposed through said aperture, to form a region of opposite conductivity-type within said epitaxially deposited layer of said first conductivity-type, (e) shaping said substrate into an optical lens which focuses radiation on said epitaxially deposited layer, (f) removing another portion of said mask to expose a second portion of the surface of said epitaxially deposited layer, (g) attaching an ohmic contact to said second portion of said epitaxially deposited layer, and (h) attaching an ohmic contact to said region of opposite conductivity-type.

References Cited

UNITED STATES PATENTS

| | | | |
|---|---|---|---|
| 2,794,846 | 6/1957 | Fuller | 136—89 |
| 2,964,636 | 12/1960 | Cury | 250—211 |
| 3,076,861 | 2/1963 | Samulon et al. | 136—89 |
| 3,082,283 | 3/1963 | Anderson | 136—89 |
| 3,089,794 | 5/1963 | Marinace | 148—75 |
| 3,165,811 | 1/1965 | Kleimack et al. | 148—75 |
| 3,223,904 | 12/1965 | Warner et al. | 317—235 |

RALPH G. NILSON, *Primary Examiner.*

M. ABRAMSON, *Assistant Examiner.*